United States Patent
Fischer

(10) Patent No.: US 6,836,283 B2
(45) Date of Patent: Dec. 28, 2004

(54) METHOD OF SETTING THE IMAGE LINE WIDTH IN AN EXPOSER

(75) Inventor: Jörg-Achim Fischer, Laboe, DE (US)

(73) Assignee: Heidelberger Druckmaschinen AG, Heidelberg (DE)

( * ) Notice: Subject to any disclaimer, the term of this patent is extended or adjusted under 35 U.S.C. 154(b) by 99 days.

(21) Appl. No.: 10/384,306

(22) Filed: Mar. 7, 2003

(65) Prior Publication Data

US 2003/0179282 A1 Sep. 25, 2003

(30) Foreign Application Priority Data

Mar. 22, 2002 (DE) .......................................... 102 12 937

(51) Int. Cl.⁷ .............................. B41J 2/435; B41J 2/47
(52) U.S. Cl. ........................ 347/253; 347/251; 347/240
(58) Field of Search ................................ 347/251, 253, 347/254, 240

(56) References Cited

U.S. PATENT DOCUMENTS 5,671,005 A * 9/1997 McNay et al. .............. 347/262
5,831,659 A 11/1998 Baek et al.

2002/0044196 A1 4/2002 Vosseler et al.

FOREIGN PATENT DOCUMENTS

| DE | 196 15 050 A1 | 10/1996 |
|----|---------------|---------|
| DE | 100 35 848 A1 | 2/2002  |
| JP | 09001674 A    | 1/1997  |

* cited by examiner

*Primary Examiner*—Huan Tran
(74) *Attorney, Agent, or Firm*—Laurence A. Greenberg; Werner H. Stemer; Gregory L. Mayback

(57) ABSTRACT

The method is for setting the line width of recorded image lines of a focused image beam in an exposer. The exposure point has a diameter and an area with a non-uniformly distributed power density. The recording material has a first exposure threshold and is exposed with an energy density near a second exposure threshold that is substantially higher than the first exposure threshold. The recording material can be a photopolymer printing plate. The line width of the recorded image lines is determined from the distribution of the power density over the area of the exposure point by integrating the time variation of the power density resulting from the exposure speed of the laser beam. The line width is set, by changing the diameter of the exposure point and/or by the laser power, such that the line width is substantially equal to the line spacing.

9 Claims, 3 Drawing Sheets

METHOD OF SETTING THE IMAGE LINE WIDTH IN AN EXPOSER

BACKGROUND OF THE INVENTION

Field of the Invention

The invention relates to the field of electronic reproduction technology and pertains to a method of setting the line width of recorded image lines in an exposer (output scanner, output recorder) for recording printing originals, such as printing plates.

In electronic reproduction technology, recording devices are used to expose printing originals and printing forms. For this purpose, a laser beam is, for example, produced by a laser diode, shaped by an optical device, and focused onto the recording material. The laser beam is deflected over the recording material, point by point, and line by line, by a deflection system. There are also recording devices which, in order to increase the exposure speed, produce a bundle of laser beams, for example, using a separate laser diode for each laser beam, and expose a plurality of image lines of the printing form simultaneously each time they sweep over the recording material. The printing forms can be exposed on film material to produce color separation films that can subsequently be used for producing printing plates with a photographic recopying method. Instead, the printing plates themselves can also be exposed in a plate exposer or directly in a digital press. The recording material can be located on a drum (external drum exposer), in a cylindrical hollow (internal drum exposer) or on a flat surface (flat bed exposer).

In the case of an external drum exposer, the material to be exposed, in the form of films or printing plates, is mounted on a rotatably mounted drum. While the drum rotates, an exposure head is moved axially along the drum at a relatively short distance. The exposure head focuses one or more laser beams onto the drum surface. The beams sweep over the drum surface in the form of a narrow helical line. In this way, during each revolution of the drum, one or more image lines are exposed on the recording material.

In the case of an internal drum exposer, the material to be exposed is mounted on the internal surface of a partly open hollow cylinder and is exposed with a laser beam that is aimed along the cylinder axis onto a deflection device that reflects the laser beam at right angles onto the material. The deflection device, a prism or a mirror, is rotated during operation and is additionally moved slowly in the direction of the cylinder axis, so that the deflected laser beam makes circular or helical image lines on the material, in order to scan the entire surface of the material little by little.

Flat bed exposers operate predominantly with a rapidly rotating polygonal mirror, whose mirror surfaces deflect the laser beam transversely over the recording material, while at the same time the recording material is moved at right angles to the deflection direction of the laser beam. In this way, exposure is carried out image line by image line. Since the length of the light path changes during the movement of the laser beam over the recording material, complicated imaging optics are required, which compensate for size changes thereby induced in the exposure point.

As compared with flat bed exposers, internal drum exposers have the advantage that the optical paths are shorter, so that less expenditure for vibration damping is required. In addition, the length of the light path is constant, so that it is possible to manage with simpler imaging optics. Because of the few and rapidly moving parts, high exposure speeds are achieved with internal drum exposers. Because of the construction, when using an external drum exposer, the achieved exposure speeds are not so high, since a large mass has to be moved and the rotational speed of the drum is limited by the centrifugal forces which, at too high a rotational speed, would separate the recording material from the drum. The advantage with the external drum exposer is that the light path from the laser to exposure point is very short. This permits a configuration of the imaging optics with which a very sharp beam profile is produced. Because of the longer light path, this is not possible in an internal drum exposer, so that the beam profile has a distribution of the power density from the center to the edge of the laser beam in the form of a Gauss bell curve, for example.

During the exposure of printing originals, the laser beam is not modulated with a continuously varying signal, but is switched on and off on the basis of a binary image signal which can assume only two values. The reason for this is that the printing originals are screened, that is to say different tonal values in the color separations are represented by halftone dots whose size is varied in accordance with the tonal values. During the exposure of the printing originals, the half tone dots are composed of many small exposure points, for example, with a resolution of 1,000 exposure points/cm. In order to achieve this resolution, the image lines must have a spacing of a=10 $\mu$m, for example. Whether the diameter d of the exposure points in this example must likewise be set to d=10 $\mu$m depends on the beam profile of the laser beam and on the exposure characteristics of the recording material. For the following explanations, the diameter d will be defined as 50% diameter that results from the radius at which the power density of the laser beam has fallen to 50% of its maximum value at the center of the beam.

If there is a sharp beam profile, such as in the case of an external drum exposer, that is to say there is a uniform distribution of the power density over the area of the exposure point, the 100% diameter of the exposure point is set to the dimension of the line spacing a or somewhat larger. This is because adjacent image lines adjoin one another exactly or overlap somewhat, which ensures that no unexposed areas are produced between adjacent image lines, which would be disruptively visible in the finished recording of the printing original. If, as in an internal drum exposer for example, the beam profile follows a gaussian curve, the 50% diameter d of the exposure point is preferably set such that it corresponds to the image line spacing a, that is to say, in the example of a resolution of 1,000 exposure points/cm, the line spacing a=10 $\mu$m and the 50% diameter is likewise d=10 $\mu$m. This basic setting of the diameter of the exposure point has been tried and tested in practice for films and printing plates with a photosensitive layer of silver halide, which generally have a light sensitivity curve with a pronounced exposure threshold. If the incident energy density exceeds the exposure threshold, the material is exposed, and at an energy density lying below this, it remains unexposed. The basic setting of the line width in an exposer is optimized during daily operation by being readjusted in fine steps by changing the laser power. In this way, varying characteristics of the recording material and of the developing scheme are compensated for. For this purpose, test exposures are carried out with various line widths and are measured. The parameters that result in the best line connection between adjacent image lines are then set in the exposer.

For some time, offset printing plates have been available which are built up from a carrier material and a photopolymer layer applied thereto and which behave differently than a typical photosensitive layer based on silver halide. FIG. 1 shows in qualitative terms a typical exposure curve for a photopolymer printing plate. Plotted on the horizontal axis is the energy density H with which the printing plate is exposed, and the effect W of the exposure is plotted on the vertical axis. When a first exposure threshold M1 is exceeded, polymerization is triggered in the photopolymer layer, and crosslinks the molecules. As a result, the exposed areas become resistant to the developer solution, with which the unexposed areas are washed out in a subsequent process. However, the exposed areas are not yet resistant enough against the wear in the press if they have been exposed only with an energy density that is slightly above the first exposure threshold M1. Therefore, exposed and developed printing plates do not last long enough to be able to print large editions. In order to consolidate the exposed areas in such a way that they become resistant to the wearing processes in the press, they must be exposed relatively far beyond the first exposure threshold M1. Beginning at a second exposure threshold M2, which may be considerably higher than the first exposure threshold M1, the consolidation of the polymer has progressed to such an extent that no substantial further consolidation is achieved with even more intense exposure. In the area of the second exposure threshold M2 and beyond this, the energy density H used for the exposure can be selected within wide limits, for example, in order to set the line width b optimally by changing the laser power. In this case, however, the known methods for the optimum setting of the diameter d of the exposure point or the line width can no longer be applied to a beam profile having a gaussian curve.

There is also the possibility of exposing the photopolymer printing plate in the exposer only with an energy density H corresponding to the first exposure threshold M1 and, following the development, of carrying out a reexposure with UV light in order thereby to reharden the polymer structures that have not been washed out. However, this mode of operation entails additional expenditure on time and labor and is therefore disadvantageous.

SUMMARY OF THE INVENTION

It is accordingly an object of the invention to provide a method of setting the line width of recorded image lines of a laser beam focused on an exposure point in an exposer for recording printing originals on a recording material, which overcomes the above-mentioned disadvantages of the prior art methods of this general type.

In particular, an object of the invention is to provide a method with which, for a photopolymer recording material and a given beam profile of the laser beam, the line width can be set optimally in an exposer, so that no underexposed areas are produced between adjacent image lines. In addition, the exposure is carried out in one operation with a sufficiently high energy density, so that no reexposure of the recording medium is required in order to consolidate the polymer structures.

With the foregoing and other objects in view there is provided, in accordance with the invention, a method of setting a line width of recorded image lines from a laser beam, which is focused on an exposure point in an exposer for recording printing originals on a recording material, and which has an exposure speed, while using a predefined image line spacing. The method includes steps of: setting a diameter of the exposure point to be smaller than the line spacing and providing an area of the exposure point with a power density having a non-uniform distribution; providing the recording material with surface characteristics and a first exposure threshold such that when the first exposure threshold is exceeded, the surface characteristics of the recording medium change; and in the exposer, exposing the recording material with an energy density that is substantially higher than the first exposure threshold.

In accordance with an added feature of the invention, the recording material includes a photopolymer layer.

In accordance with an additional feature of the invention, the energy density, which is used during the step of exposing the recording material, is near a second exposure threshold that ensures consolidation of the photopolymer layer.

In accordance with another feature of the invention, the exposer is an internal drum exposer.

In accordance with a further feature of the invention, the method includes determining the line width of the recorded image lines from the distribution of the power density over the area of the exposure point by integrating a time variation of a power density that results from the exposure speed of the laser beam.

In accordance with a further added feature of the invention, when performing the step of setting the diameter of the exposure point, the diameter of the exposure point is set such that the line width is substantially equal to the line spacing.

In accordance with a further additional feature of the invention, the diameter of the exposure point is given by a radius at which the power density has fallen to 50% of a maximum value of the power density.

In accordance with yet an added feature of the invention, the line width is set by changing a power of the laser beam.

In accordance with yet an additional feature of the invention, when performing the step of setting the line width, the line width is set to be substantially equal to the line spacing.

Other features which are considered as characteristic for the invention are set forth in the appended claims.

Although the invention is illustrated and described herein as embodied in a method of setting the image line width in an exposer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
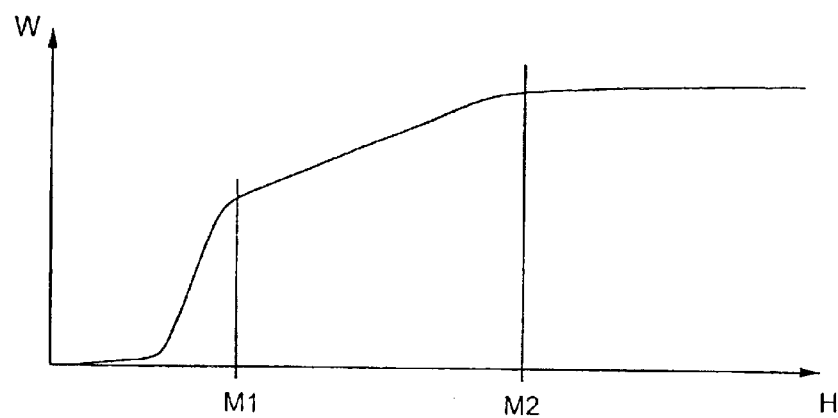
FIG. 1 is a graph of an exposure curve for a photopolymer material.
Figure 2:
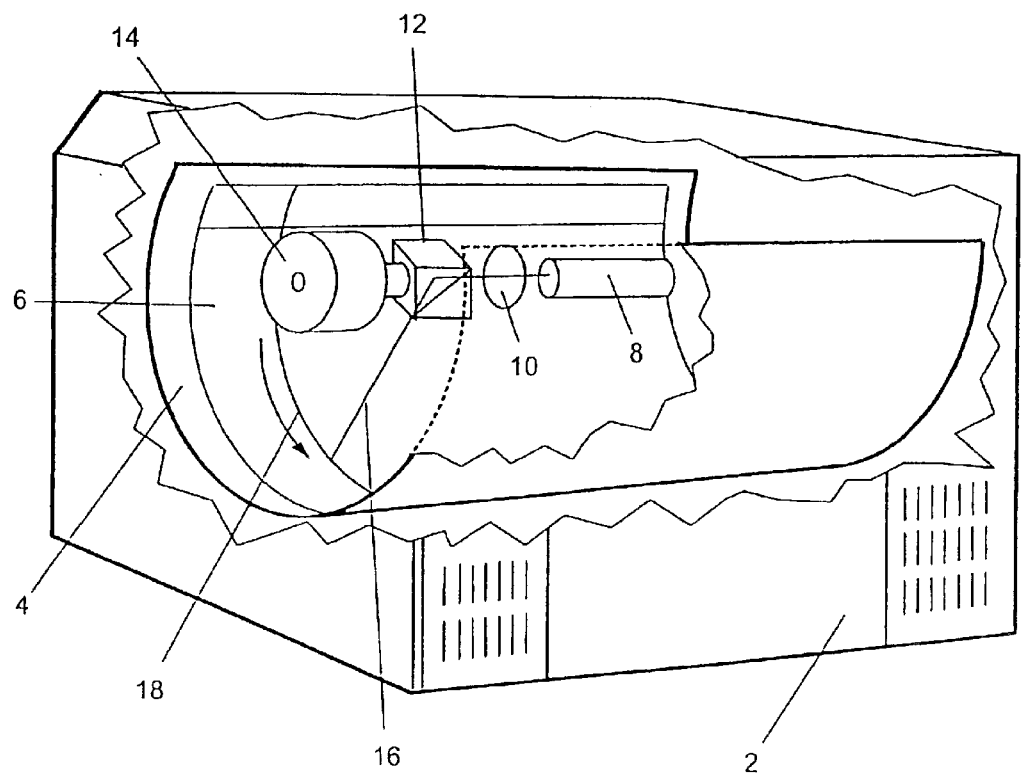
FIG. 2 is a schematic representation of an internal drum exposer.

Referring now to the figures of the drawing in detail and first, particularly, to FIG. 2 thereof, there is schematically shown, the construction of an internal drum exposer that carries out the exposure with a single laser beam. Formed in a housing 2 is a semicylindrical trough 4 having an inner surface for resting thereon, a recording material 6 to be exposed, for example, a film or a flexible printing plate. Arranged in a row on the axis of the semicylindrical trough 4, are a laser 8, imaging optics 10, a reflecting prism 12 having a reflective surface that is inclined at 45° with respect to the axis of the trough 4, and a motor 14. The prism 12 is fixed to the drive shaft of the motor 14, which runs along the axis of the trough 4. The laser 8, the imaging objective 10, the prism 12 and the motor 14 are arranged on a carriage, not shown, which during operation is moved slowly in the direction of the axis of the trough 4. A laser beam 16 emerging from the laser 8 is deflected through 90° by the rotating prism 12 and then strikes the recording material 6, on which it writes a circular or helical image line 18.

Figure 3:
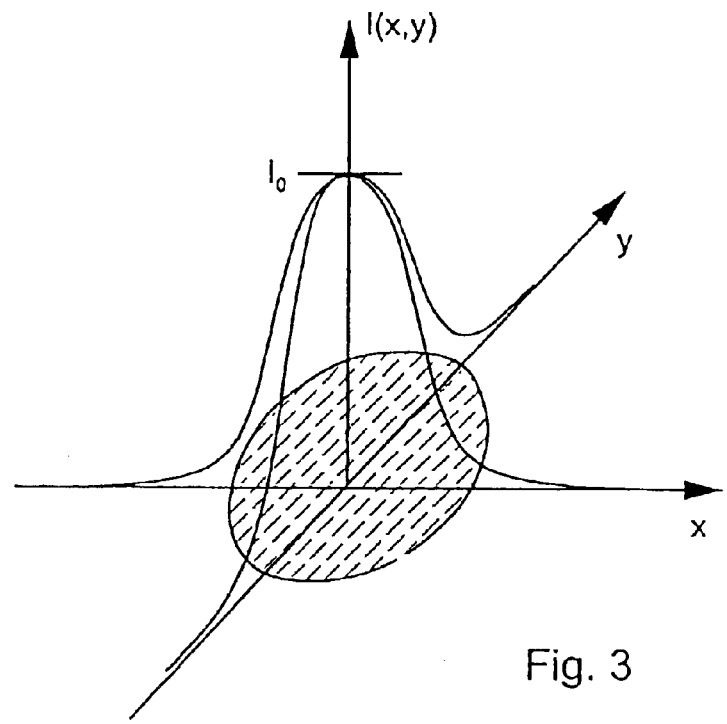
FIG. 3 is a graph of the beam profile of a laser beam.

Because of the relatively long light path in an internal drum exposer from the laser 8 to the material 6, it is not possible to construct the imaging optics 10 in such a way that the exposure point that is focused on the material 6 has a uniformly distributed power density over its area. The exposure point has a non-uniformly distributed power density, which has a maximum at the center and decreases in all directions toward the edge of the exposure point. Such a profile of the focused laser beam is indicated in FIG. 3. The distribution of the power density in accordance with a two-dimensional Gauss function is typical, for example:

$$I(x, y) = I_0 \times e^{-(\frac{x}{e1})^2} \times e^{-(\frac{y}{e1})^2} \quad (1)$$

Here, $$I_0 = \frac{P}{\pi \times e1 \times e1} \quad (2)$$

is the power density at the center of the exposure point, and e1 is the radius at which the power density has fallen by the factor 1/e. The 1/e radius e1 can be calculated from the 50% diameter d in accordance with the following relationship:

$$e1 = 0.6 \times d. \quad (3)$$

Figure 4:
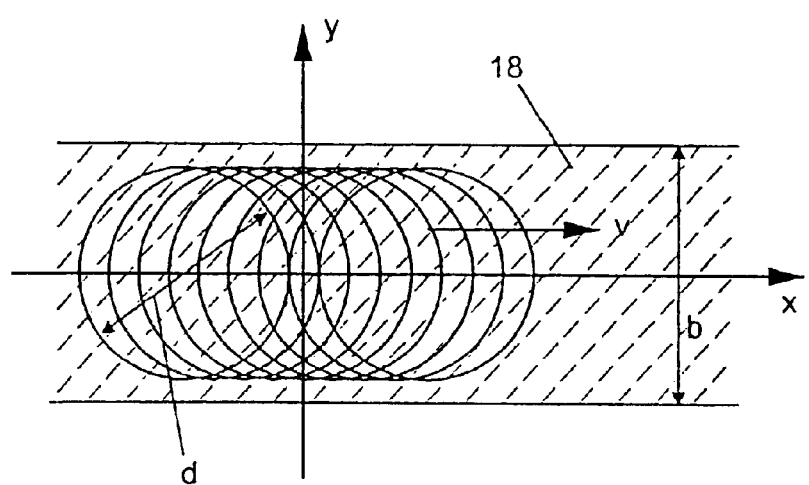
FIG. 4 is a graph of the cross section of an image line.

FIG. 4 shows a section of the image line 18 which is produced when the exposure point with the 50% diameter d and the power density profile according to equation (1) sweeps over the recording material 6 in the x direction at the speed v. The width b of the image line 18 is to be determined. For this purpose, for a stationary axis which lies at right angles to the direction of movement of the exposure point, for example, for the y axis in FIG. 4, the incident energy density H(y) is determined, resulting from the integration of the power density components on the y axis for the various x positions of the exposure point. If the relationship x=v×t is inserted into the power density profile for the x position, then the result is an integration over the time variation of the power density at each point on the stationary axis.

$$H(y) = \frac{P}{\pi \times e1 \times e1} \times e^{-(\frac{y}{e1})^2} \int_{-\infty}^{\infty} e^{-(\frac{v \times t}{e1})^2} dt \quad (4)$$

The integral has the value:

$$\int_{-\infty}^{\infty} e^{-(\frac{v \times t}{e1})^2} dt = \frac{e1 \times \sqrt{\pi}}{v} \quad (5)$$

so that, for the energy density distribution H(y) along the y axis, the result is:

$$H(y) = \frac{P}{v \times e1 \times \sqrt{\pi}} \times e^{-(\frac{y}{e1})^2} \quad (6)$$

Figure 5:
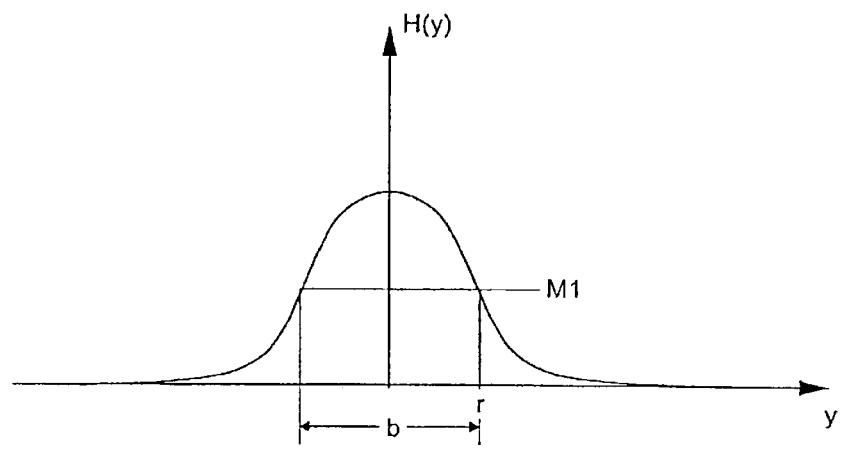
FIG. 5 is a graph of the energy density distribution, transverse with respect to the direction of movement of the laser beam.

FIG. 5 shows this function. The width b of the image line 18 results from the two points on the curve H(y) at which the energy density H exceeds the first exposure threshold M1 of the recording material 6, that is to say, with r=b/2:

$$M = H(r) = \frac{P}{v \times e1 \times \sqrt{\pi}} \times e^{-(\frac{r}{e1})^2} \quad (7)$$

This relationship can be solved for r, and this ultimately results in a function for the width b of the image line 18 as a function of the laser power P, of the exposure threshold M1 of the recording material 6, of the speed v of the exposure point and of the 1/e radius of the exposure point. The width b of the image line 18 can be found by:

$$b = 2 \times r = 2 \times e1 \times \sqrt{\ln\left[\frac{P}{M1 \times v \times e1 \times \sqrt{\pi}}\right]} \quad (8)$$

For a simplified representation of this function, a standardized energy density $H_N$ with the unit Ws/m² is introduced, which is formed from the ratio of the laser power P to the exposure speed v and to a normalized diameter $d_N$=10 μm of the exposure point.

$$H_N = \frac{P}{10 \times 10^{-6} \times v} \left[\frac{W}{m \times m/s} = \frac{Ws}{m^2}\right] \quad (9)$$

Therefore, the following relationship emerges from equation (8):

$$b = 2 \times e1 \times \sqrt{\ln\left[H_N \times \frac{10 \times 10^{-6}}{M1 \times e1 \times \sqrt{\pi}}\right]} \quad (10)$$

Figure 6:
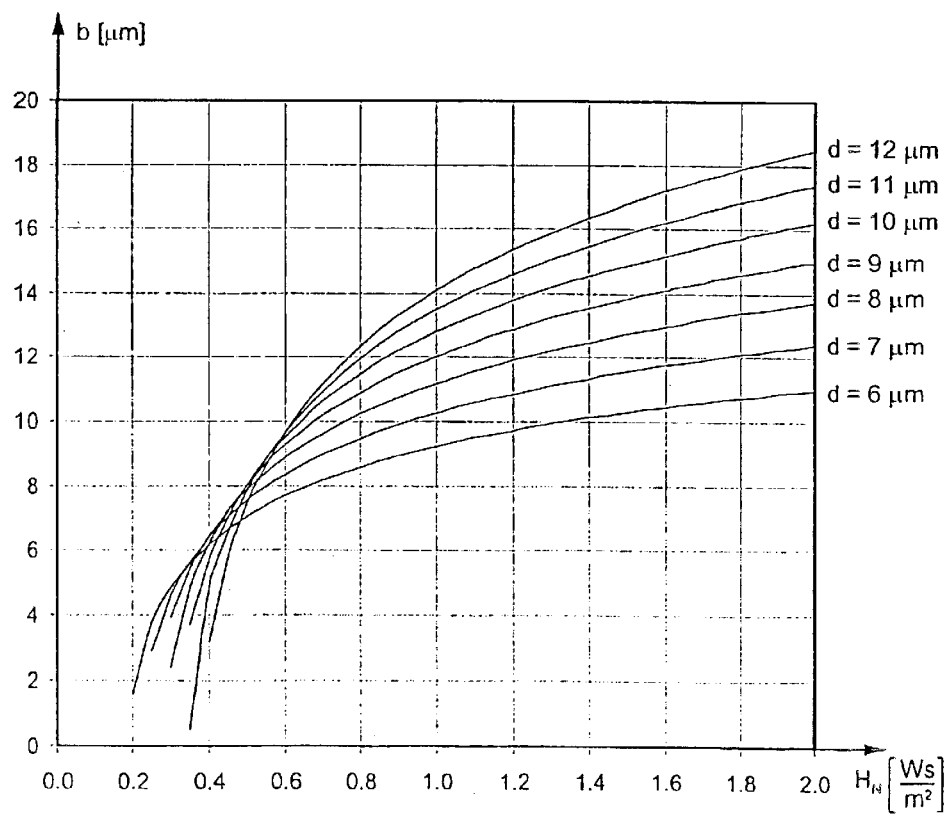
FIG. 6 is a graph of the line width as a function of the energy density.

FIG. 6 shows examples of this relationship as a family of curves with the 50% diameter d as the parameter. Here, the 50% diameter d according to equation (3) has been converted to the 1/e radius, and for the exposure threshold M1, a value of M1=0.3 Ws/m², typical of a photopolymer printing plate, has been used. From the curves it is possible to gather, for example, that exposing the photopolymer printing plate with an exposure point, which corresponding to the desired resolution of 1,000 exposure points/cm, has a 50% diameter d=10 μm corresponding to the line spacing a=10 μm, and which has an energy density in the region of the second exposure threshold M2 of $H_N$=0.8 Ws/m² in order to consolidate the polymer structure sufficiently, produces a line width b=11.5 μm. The image lines become too wide and overlap to too great an extent. From the curves, it is furthermore possible to gather that an intended line width b=10 μm for the selected energy density $H_N$ can be achieved with a 50% diameter d=7.7 μm. The photopolymer printing plate must therefore be exposed with a smaller exposure point than, for example, a silver halide printing plate if the exposure is increased above the first exposure threshold M1 in order to achieve a large edition size as a result of the adequate consolidation of the polymer structure in the exposed printing plate. In quantitative terms, the requisite 50% diameter d of the exposure point is determined in accordance with the invention by the method described from the power density distribution over the area of the exposure point. The 50% diameter d of the exposure point can be set by changing the imaging geometry, for example, by changing the spacing between the laser 8 and the imaging optics 10 (FIG. 2). As revealed by equations (9) and (10), the line width b at a given 50% diameter d of the image point and with a given exposure speed v of the laser beam can also be set by changing the laser power P. This possibility of adapting the line width b to the desired resolution and therefore to the desired image line spacing a is preferred for cost reasons. A possibility of adjusting the imaging geometry in fine steps, in order to adapt the 50% diameter d optimally to the desired resolution in each case with a fixed energy density $H_N$, is considerably more complicated. A further preferred embodiment is also the combination of the two possible settings, setting the 50% diameter in a few coarse steps by changing the imaging geometry and adapting the line width b in fine steps by changing the laser power.

The method of calculating the line width b can be applied in a corresponding way to any desired shape of the laser beam profile, that is to say including beam profiles that do not follow a Gauss curve, or to beam profiles that are not rotationally symmetrical.

I claim:

1. A method of setting a line width of recorded image lines from a laser beam, which is focused on an exposure point in an exposer for recording printing originals on a recording material, and which has an exposure speed, while using a predefined image line spacing, the method which comprises:

setting a diameter of the exposure point to be smaller than the line spacing and providing an area of the exposure point with a power density having a non-uniform distribution;

providing the recording material with surface characteristics and a first exposure threshold such that when the first exposure threshold is exceeded, the surface characteristics of the recording medium change; and in the exposer, exposing the recording material with an energy density that is substantially higher than the first exposure threshold.

2. The method according to claim 1, wherein the recording material includes a photopolymer layer.

3. The method according to claim 2, wherein the energy density, which is used during the step of exposing the recording material, is near a second exposure threshold that ensures consolidation of the photopolymer layer.

4. The method according to claim 1, which comprises providing the exposer as an internal drum exposer.

5. The method according to claim 1, which comprises determining the line width of the recorded image lines from the distribution of the power density over the area of the exposure point by integrating a time variation of a power density that results from the exposure speed of the laser beam.

6. The method according to claim 1, which comprises, when performing the step of setting the diameter of the exposure point, setting the diameter of the exposure point such that the line width is substantially equal to the line spacing.

7. The method according to claim 1, wherein the diameter of the exposure point is given by a radius at which the power density has fallen to 50% of a maximum value of the power density.

8. The method according to claim 1, which comprises setting the line width by changing a power of the laser beam.

9. The method according to claim 8, which comprises, when performing the step of setting the line width, setting the line width to be substantially equal to the line spacing.

* * * * *